United States Patent
Honmura et al.

(10) Patent No.: US 9,854,705 B2
(45) Date of Patent: Dec. 26, 2017

(54) SHEET-TYPE HEAT PIPE

(71) Applicant: Toshiba Home Technology Corporation, Kamo-shi, Niigata (JP)

(72) Inventors: Osamu Honmura, Kamo (JP); Nobuyuki Kojima, Kamo (JP); Naoto Sakuma, Kamo (JP)

(73) Assignee: TOSHIBA HOME TECHNOLOGY CORPORATION, Kamo-Shi, Niigata (JP)

( * ) Notice: Subject to any disclaimer, the term of this patent is extended or adjusted under 35 U.S.C. 154(b) by 293 days.

(21) Appl. No.: 14/572,898

(22) Filed: Dec. 17, 2014

(65) Prior Publication Data
US 2015/0181764 A1  Jun. 25, 2015

(30) Foreign Application Priority Data
Dec. 24, 2013  (JP) ................ 2013-265394

(51) Int. Cl.
*F28D 15/00* (2006.01)
*H05K 7/20* (2006.01)
(Continued)

(52) U.S. Cl.
CPC ..... *H05K 7/20336* (2013.01); *F28D 15/0233* (2013.01); *F28D 15/04* (2013.01); *H01L 23/427* (2013.01); *H01L 2924/0002* (2013.01)

(58) Field of Classification Search
CPC ....... H05K 7/20336; H05K 2203/0323; H05K 2203/0369; F28D 15/0233; F28D 15/04; H01L 23/427
See application file for complete search history.

(56) References Cited

U.S. PATENT DOCUMENTS

| 3,177,103 A * | 4/1965 | Tally .................. C23F 1/02 174/254 |
| 2006/0096740 A1* | 5/2006 | Zheng .............. F28D 15/0233 165/104.26 |

(Continued)

FOREIGN PATENT DOCUMENTS

| CA | 2272260 A1 * | 5/1998 | ............. F28D 15/02 |
| CN | 1403777 A | 3/2003 | |

(Continued)

OTHER PUBLICATIONS

Novel Concepts, Inc. Product Page: Heat Spreaders. Available to public on Aug. 7, 2011. Website: http://www.novelconceptsinc.com/heat-spreaders.htm.*

(Continued)

*Primary Examiner* — Len Tran
*Assistant Examiner* — Gordon Jones
(74) *Attorney, Agent, or Firm* — Troutman Sanders LLP

(57) ABSTRACT

Provided is a sheet-type heat pipe that has a sufficient heat transport capability and can be effortlessly installed in a thin chassis. The sheet-type heat pipe is made of a sealed container formed by stacking and joining together at least two etched sheet bodies formed as metal foil sheets. Particularly, etching or pressing is performed on the surface of the sheet bodies to join at least two sheet bodies such that fine concavities and convexities can be formed on the inner surface of the container and the sheet-type heat pipe with a sufficient heat transport capability can thus be obtained even when the sealed container is thinly formed with its thickness not larger than, e.g. 0.5 mm. More particularly, since the thickness of the container is thinly formed, the sheet-type heat pipe of the present invention can be effortlessly installed in a thin chassis of a mobile terminal.

8 Claims, 8 Drawing Sheets
(1 of 8 Drawing Sheet(s) Filed in Color)

(51) Int. Cl.
*H01L 23/427* (2006.01)
*F28D 15/04* (2006.01)
*F28D 15/02* (2006.01)

(56) References Cited

U.S. PATENT DOCUMENTS

| | | | |
|---|---|---|---|
| 2006/0157227 A1 | 7/2006 | Choi et al. | |
| 2012/0186784 A1* | 7/2012 | Yang | F28D 15/0266 165/104.21 |
| 2013/0128461 A1 | 5/2013 | Nagasawa | |

FOREIGN PATENT DOCUMENTS

| | | | |
|---|---|---|---|
| CN | 1781007 A | 5/2006 | |
| CN | 102313472 A * | 1/2012 | ............. F28D 15/04 |
| CN | 202135434 U | 2/2012 | |
| JP | 2006526128 A | 11/2006 | |
| JP | 2007183021 A * | 7/2007 | ............. F28D 15/02 |
| JP | 2011127780 A | 6/2011 | |
| JP | 2012-186692 | 9/2012 | |
| KR | 100942063 B1 | 2/2010 | |
| WO | 2004106822 A1 | 12/2004 | |
| WO | WO 2004106822 A1 * | 12/2004 | ............. B82Y 30/00 |

OTHER PUBLICATIONS

Japanese Office Action dated Jan. 19, 2016, issued in corresponding Japanese Patent Application No. JP2013-265394.
Japanese Office Action dated Sep. 6, 2016 ssued in corresponding Japanese Patent Application No. 2013-265394.
Chinese First Office Action dated Jan. 25, 2017 issued in Chinese Application No. 201410705350.8 (including brief English Translation).

* cited by examiner

| | Embodiment of the present invention (Sheet-type heat pipe) | | | | | Alternative embodiment | Related art |
|---|---|---|---|---|---|---|---|
| | Width 60mm | Width 45mm | Width 30mm | Width 15mm | | HP+copper plate t0.2 | Graphite sheet |
| Heat source temperature | 66.9°C | 71.4°C | 73.9°C | 90.7°C | | 76.0°C | 107.6°C |
| Outer frame temperature | Max.49.8°C | Max.52.2°C | Max.54.2°C | Max.64.1°C | | Max.56.7°C | Max.70.9°C |
| Touch panel | | | | | | | |
| Outer frame temperature | Max.46.5°C | Max.48.8°C | Max.48.2°C | Max.53.1°C | | Max.46.6°C | Max.50.4°C |
| Chassis rear surface | | | | | | | |
| Heat dissipation performance | ◎ | ◎ | ○ | △ | | ○ | × |
| Primary specification | W60×H105 | W45×H105 | W30×H105 | W15×H105 | | Copper plate:W60×H105 | W60×H105 |
| Heat dissipation area | 6,300mm² | 4,725mm² | 3,150mm² | 1,575mm² | | 6,300mm² | 6,300mm² |
| HP thickness | t0.4 | t0.4 | t0.4 | t0.4 | | t0.5~t0.8 | — |
| Overall thickness | t0.4 | t0.4 | t0.4 | t0.4 | | t0.7~t1 | t0.017 |

FIG.11

SHEET-TYPE HEAT PIPE

CROSS REFERENCE TO RELATED APPLICATION

This application claims priority under 35 U.S.C. §119 to Japanese Patent Application No. 2013-265394, filed on Dec. 24, 2013, the entire content of which being hereby incorporated herein by reference.

BACKGROUND OF THE INVENTION

Field of the Invention

The present invention relates to a sheet-type heat pipe that is small but brings about a sufficient amount of heat transport, the heat pipe capable of being installed in a mobile terminal such as a smartphone or a tablet terminal.

Description of Related Art

Conventionally, in order to diffuse a heat generated by a CPU installed in a mobile device such as a tablet terminal, there has been proposed, for example, a heat dissipation structure disclosed in JP-A-2012-186692. This heat dissipation structure is characterized by mixing into a heat dissipation sheet a graphite having a high thermal conductivity.

SUMMARY OF THE INVENTION

However, the conventional structure has failed to bring about a sufficient heat diffusion such that the temperature of a CPU sometimes surpassed a restrictive temperature, and that a heat spot(s) occurred on an outer frame of the mobile device. Therefore, it has been imperative to control the heat generation of the CPU. That is, it has been impossible to make best use of the capabilities of the CPU.

Meanwhile, there has also been known a heat dissipation structure for diffusing the heat generated by a CPU through a heat pipe. However, due to the restriction of a preferred size of a mobile device such as a tablet terminal, it is difficult to secure a space inside a chassis of the mobile device that is large enough to receive a heat pipe having a diameter of no smaller than .phi.3 mm. Especially, as for a mobile terminal such as a smartphone, the thickness of its chassis is restricted for ease of use, which makes it difficult to install the heat pipe. Further, a pipe-shaped heat pipe is incapable of performing a favorable heat diffusion in a wide region of the mobile terminal, thus making it impossible for the mobile terminal to take full advantage of a heat-generating component such as the CPU.

In view of the aforementioned problems, it is an object of the present invention to provide a sheet-type heat pipe that has a sufficient heat transport capability and can be effortlessly installed in a thin chassis.

A sheet-type heat pipe of the present invention comprises a sealed container. The sealed container further comprises at least two etched or pressed metal foil sheets stacked and joined together.

According to the invention of a first aspect, etching or pressing is performed on the metal foil sheets, and the container is sealed by joining at least two metal foil sheets. For this reason, fine concavities and convexities can be formed on the inner surface of the container, and thus there can be obtained a thin sheet-type heat pipe having a sufficient heat transport capability even when the sealed container is formed thin. Moreover, since the container is formed thin, the sheet-type heat pipe can be effortlessly installed in a thin chassis such as that of a mobile terminal.

According to the invention of a second aspect, by performing half-etching on the surface of each metal sheet, there can be formed on the inner surface of the container grooves for a fine vapor passage and those for wicks having a sufficient heat transport capability. Further, as a result of limiting the thickness of a container formed by laminating metal foil sheets, to a thickness of no larger than 0.5 mm, the sheet-type heat pipe can be effortlessly installed in a thinner chassis such as that of the mobile terminal.

According to the invention of a third aspect, as a result of limiting the thickness of a region of each metal foil sheets that becomes the vapor passage, to not larger than 0.14 mm, not only the heat transportation capability of the vapor passage can be improved, but the overall thickness of the container 15 can be restricted as well. Meanwhile, if the thickness k1 is set to be no smaller than 0.03 mm, the container can be prevented from being crashed by the atmospheric pressure even when the container is sealed and evacuated inside.

According to the invention of a fourth aspect, by setting the width of the vapor passage to be no smaller than 0.5 mm, cross section required as a vapor passage can be ensured to achieve a desired heat transportation capability. On the other hand, if the width of the vapor passage is set to be not larger than 2.7 mm, the container can be prevented from being crashed by the atmospheric pressure even when the container is sealed and evacuated inside.

According to the invention of a fifth aspect, by properly setting the thickness to width ratio in the region of the metal foil sheets that becomes a vapor passage, heat transportation in the vapor passage can be enhanced while limiting the overall thickness of the container. In addition, the container can be prevented from being crashed by the atmospheric pressure.

According to the invention of a sixth aspect, by thickly forming the heavily stressed regions adjacent to where the grooves serving as wicks are formed while by thinly forming the one in the less stressed central region, not only the container can be prevented from being crashed by the atmospheric pressure but required cross section for the vapor passage can be ensured as well since, inside the vapor passage, the wall surface of the vapor passage is stressed by the atmospheric pressure due to the fact that the inner side of the container is stressed by the saturated vapor pressure of the operating fluid.

According to the invention of a seventh aspect, in the vapor passage, by thickly forming a heavily stressed bilateral regions of the arch shaped passage while by thinly forming the one in the less stressed central region, not only the container can be prevented from being crashed by the atmospheric pressure outside but required cross section for the vapor passage can be ensured as well since the wall surface of the vapor passage are stressed by the atmospheric pressure due to the fact that the inner side of the container is stressed by the saturated vapor pressure of the operating fluid.

According to the invention of an eighth aspect, as for the fine grooves as the wicks, the larger the surface area thereof in contact with the liquid-phase operating fluid, the more significantly the heat transport capability improves. For this reason, by properly setting the width to depth ratio of the grooves in such a way to keep sufficient area of the cross section thereof while providing sufficiently large contacting surface area for the liquid-phase operating fluid, heat transportation capability of the wicks are allowed to be enhanced.

According to the invention of a ninth aspect, by properly setting the ratio between the width of the grooves serving as the wicks and the depth of the vapor passage, the contacting surface area for the liquid-phase operating fluid is allowed to be sufficiently large while providing a large cross section for the gas-phase operating fluid passing through the container, thereby enhancing heat transportation capability.

According to the invention of a tenth aspect, since the function of the wicks is to reflux the liquid-phase operating fluid, if the wicks are arranged to form second wicks extending from the first wicks formed on the outer circumference of the container, toward the central region thereof, operating fluid are allowed to be refluxed no matter where the heat source of e.g. the mobile terminal might be located, thereby allowing favorable heat transportation of the sheet-type heat pipe, thus obtaining sufficient heat dissipation.

According to the invention of an eleventh aspect, reflux of the liquid-phase operating fluid is categorized into: a first reflux passing from the second wicks that extend toward the central region of the container, into the first wicks formed on the outer circumference thereof; and a second reflux diverging from the first wicks formed on the outer circumference thereof into the second wicks extending toward the central region, the second reflux being brought back from the heat dissipation portion to the heat receiving portion. Here, reflux amount of the first wicks is larger than that of the second wicks. Hence, if the number of the grooves constituting the first wicks is larger than that of the second wicks, the liquid-phase operating fluid is allowed to be refluxed smoothly in the container.

According to the invention of a twelfth aspect, regarding the metal foil sheets constituting the container, in order to obtain the required sealability and proper strength as the container, the width of the contact surfaces is preferably set to be in the range of, e.g. 0.2 to 1.9 mm when laminating the two metal foil sheets in which the contact surfaces are provided as peripheral walls that are formed outside of the first wicks. Meanwhile, regarding the convex walls provided only for constituting grooves of the first wicks, it is preferable for the width of the walls to be formed narrow since the narrower walls lead to finer grooves. In the present embodiment, the width is set to be 0.1 mm which is narrower than the width of the grooves. For that reason, by properly setting the relative dimensions of the width of the peripheral wall; the width of the first wicks that are desirably finely constructed; and the width of the convex wall composing thereof, the container is allowed to maintain its strength in a proper manner while allowing the container to remain sealed, thereby optimizing the surface area where the liquid-phase operating fluid contact the first wicks; and the cross section where the gas-phase operating fluid in the vapor passage passes through, thus leading to the enhancement of heat transporting capability.

According to the invention of a thirteenth aspect, regarding the metal foil sheets constituting the container, in order to obtain the required sealability and proper strength as the container, the width of the contact surfaces are preferably set to be in the range of, e.g. 0.2 to 1.9 mm when laminating the two metal foil sheets in which the contact surfaces are provided as a wide first convex wall in the second wicks. Meanwhile, regarding the second convex walls provided only for constituting grooves of the second wicks, it is preferable for the width of the walls to be formed narrow since the narrower walls lead to finer grooves. In the present embodiment, the width is set to be 0.1 mm which is narrower than the width of the grooves. For that reason, by the properly setting the relative dimensions of: the groove width of the second wicks that are desirably finely constructed; and the width of the first convex walls, or that of the second convex walls constituting thereof, the container is allowed to maintain its strength in a proper manner while allowing the container to remain sealed, thereby optimizing the surface area where the liquid-phase operating fluid contact the second wicks; and the cross section where the gas-phase operating fluid in the vapor passage passes through, thus leading to the enhancement of heat transporting capability.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1B is to be installed.

FIG. 11 is an explanatory diagram for comparing temperature increase of the mobile terminal with one another depending on differences in cooling structures.

DETAILED DESCRIPTION OF THE INVENTION

Preferred embodiments of the present invention are described hereunder. Particularly, taken as an example is a sheet-type heat pipe that is installed in a mobile terminal such as a tablet terminal.

Figures 1A, 1B:
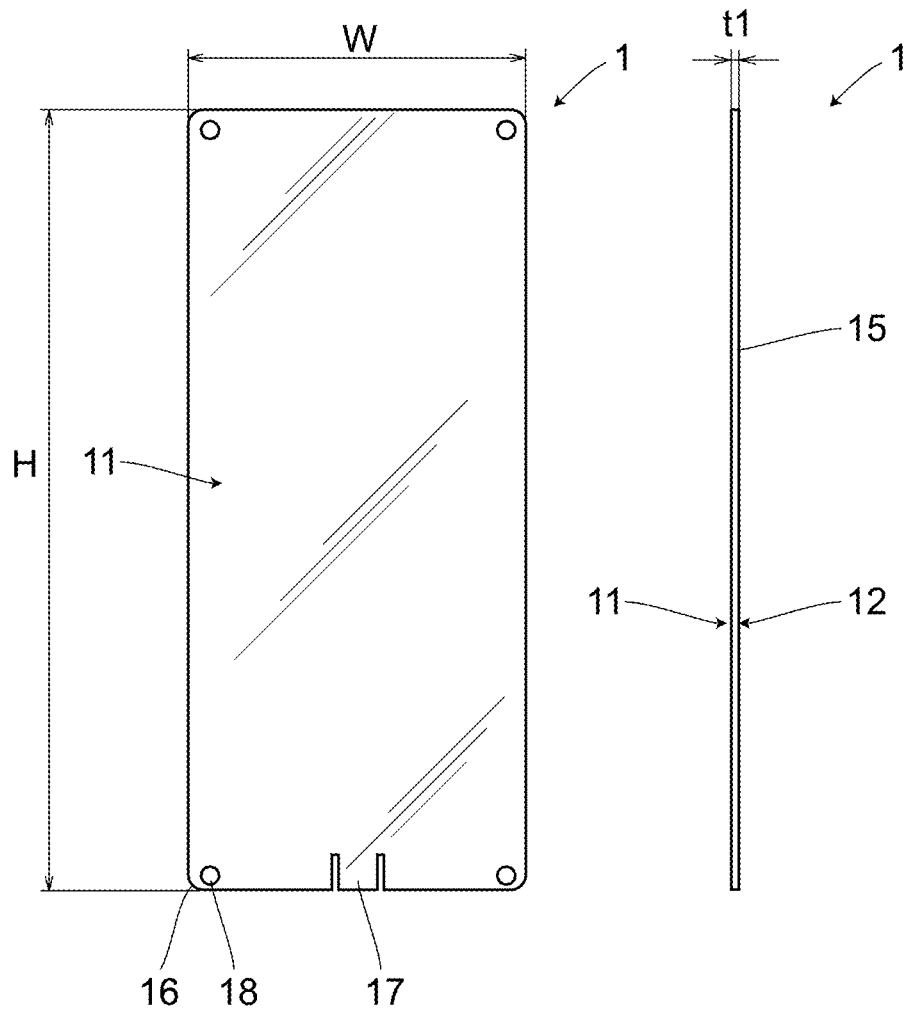
FIG. 1A is a planar view of a completed sheet-type heat pipe of a first embodiment of the present invention.
FIG. 1B is a side view of the completed sheet-type heat pipe of the first embodiment of the present invention.

FIG. 1A to FIG. 7 show a sheet-type heat pipe 1 of a first embodiment of the present invention. As illustrated in each figures, the sheet-type heat pipe 1 comprises a container 15 obtained by diffusion-joining a first sheet body 11 and a second sheet body 12 that are two copper foil sheets. As such sheet bodies 11 and 12, there may also be employed a sheet of another metal e.g. aluminum that has a favorable thermal conductivity and is capable of being etched or press formed. As shown in FIG. 1A, the sheet-type heat pipe 1 of a completed state is formed into the shape of a substantially rectangular plate, and has an outer shape matched to a chassis inner shape of a later-described mobile terminal 51 (see FIG. 8) such as a smartphone. Further, formed on four corners of the completed sheet-type heat pipe 1 are chamfered portions 16 having round shapes. Furthermore, a tube-shaped sealing portion 17 for welding is formed on the container 15 for the purpose of vacuum-encapsulating an operating fluid (not shown) such as pure water in the container 15. Here, a thickness t1 of the container 15 sealed by the sealing portion 17, i.e. a thickness of the sheet-type heat pipe 1 is 0.4 mm. Also, a reference character H as seen in FIG. 1A denotes the height of the sheet-type heat pipe 1, and a reference character W as seen in FIG. 1A denotes the width of the sheet-type heat pipe 1.

Provided on each four corners of the container 15 are attachment portions 18. The attachment portions 18 are formed as through holes for the purpose of attaching the sheet pipe onto the chassis of the mobile terminal 51. For example, the attachment portions 18 can be matched to screw holes (not shown) formed on the chassis, followed by inserting screws, not shown, as fixing members through the attachment portions 18 and then screwing these screws into the screw holes. Thus, the sheet-type heat pipe 1 can be easily attached and fixed to a desired location of the chassis of the mobile terminal 51. The attachment portions 18 are not limited to the through holes. In fact, an alternative structure is employable as long as this structure is capable of achieving the similar function as above.

Figures 2A, 2B:
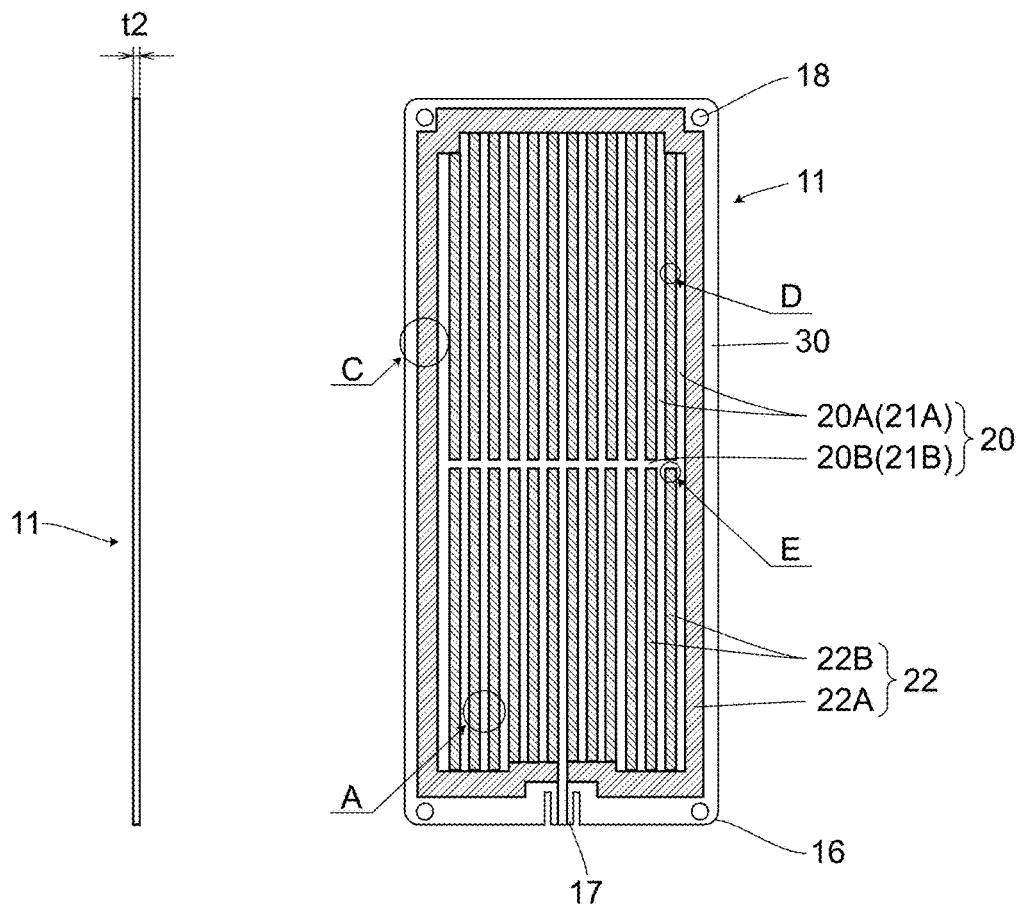
FIG. 2A is a side view of a first sheet body of the first embodiment of the present invention.
FIG. 2B is a planar view of the first sheet body of the first embodiment of the present invention.

FIG. 2A and FIG. 2B are side view and planner view of the first sheet body 11, respectively. Meanwhile, the illustration of the second sheet body 12 will be omitted hereafter since the sheet body has the same structure as that of the first sheet body 11. As shown in the figures, the thickness t2 of each sheet bodies 11 and 12 is 0.2 mm. Exclusively provided on one side surface of each sheet bodies 11 and 12 that eventually serves as the inner surface of the container 15, are a vapor passage 20 and wicks 22 which are formed through half-etching, i.e. etching is performed midway through the thickness of each sheet bodies 11 and 12. Particularly, the vapor passage 20 serves to transport to a heat dissipation portion a vapor generated from the operating fluid through evaporation at a heat receiving portion, and the wicks 22 serve to reflux to the heat receiving portion the operating fluid condensed at the heat dissipation portion. Other than the vapor passage 20 and the wicks 22, further provided on the one side surface of each sheet bodies 11 and 12 is an unetched convex side wall 30 formed along an outer circumference of each sheet bodies 11 and 12. In fact, the side walls 30, as convex walls, of the sheet bodies 11 and 12 are formed in locations where the side walls 30 are allowed to lie on top of each other when the one side surfaces of the sheet bodies 11 and 12 face each other. Eventually, the side walls 30 become a part of the outer circumferential portion of the container 15 through diffusion joining. In FIG. 2B, shown as shaded areas are the wicks 22. Further, reference characters A, C, D and E indicate sections of the sheet pipe 1 whose details are illustrated respectively in FIG. 3, FIG. 5, FIG. 6 and FIG. 7.

Further in the present embodiment, the sheet-type heat pipe 1 shown in FIG. 1A and FIG. 1B is manufactured as follows: the two identical bodies 11 and 12 are joined together with their half-etched surfaces facing each other. Particularly, the container 15 encapsulating the operating fluid is thus formed by joining together the circumferential portions of the sheet bodies and a part of the wicks thereof. At that time, the heat pipe is so configured that the joining of the outer circumferential portions of the sheet bodies allows the inner side of the heat pipe to be sealed, thus providing the heat pipe with the function as the container 15.

When forming the vapor passages 20 and the wicks 22 on the sheet bodies 11 and 12 through photo-etching, it is required that each sheet bodies 11 and 12 has a thickness t2 of no smaller than 0.05 mm. It is difficult to install the sheet-type heat pipe 1 in the mobile terminal 51 having an unique shape, when the thickness t2 of each sheet bodies 11 and 12 is larger than 0.3 mm, i.e. when the thickness t1 of the container 15 (eventually the sheet-type heat pipe 1) is larger than 0.5 mm. Therefore, as a result of etching the surfaces of the sheet bodies 11 and 12 having a thickness of 0.05 mm to 0.3 mm, and thus limiting the thickness t1 of the completed sheet-type heat pipe 1 to a thickness of not larger than 0.5 mm, not only the fine vapor passages 20 and wicks 22 with a sufficient heat transport capability can be formed on the inner surface of the container 15; but the sheet-type heat pipe 1 can be effortlessly installed in a thin chassis such as that of the mobile terminal 51.

Inside the sealed container 15, each vapor passage 20 comprises concave first passage sections 21A and a concave second passage section 21B. Particularly, a plurality of the first passage sections 21A are arranged along the longitudinal direction of each sheet bodies 11 and 12; and the second passage section 21B intersects and is communicated with each first passage sections 21A. Although the first passage sections 21A and the second passage section 21B are linear; and the first passage sections 21A and the second passage section 21B are orthogonal to one another in the central region of each sheet bodies 11 and 12, they may be formed into any shape and communicated with one another in any location. In the present embodiment, when laying the sheet bodies 11 and 12 on top of each other with the one side surfaces thereof facing each other, hollow tube-shaped first vapor paths 20A are formed as a result of allowing the first passage sections 21A of the sheet bodies 11 and 12 to face one another; and a hollow tube-shaped second vapor path 20B is formed as a result of allowing the second passage sections 21B to face each other. At that time, defined inside the container 15 is the completed vapor passage 20 composed of the first vapor paths 20A and the second vapor path 20B. That is, the plurality of the first vapor paths 20A formed along the longitudinal direction of the sheet-type heat pipe 1, are now communicated with the single second vapor path 20B established along the horizontal direction of the heat pipe 1.

Inside the container 15, the wicks 22 are now formed in locations other than where the vapor passage 20 and the side wall 30 are provided. Particularly, the wicks 22 are composed of first wicks 22A and second wicks 22B. More specifically, the first wick 22A forms the outer circumferential portion of the container 15 together with the side wall 30, and is substantially provided on the entire circumference of each sheet bodies 11 and 12 i.e. the entire circumference of the outer circumferential portion of the container 15, except the area where the vapor passage 20 extends toward the sealing portion 17. Further, the second wicks 22B are aligned along the longitudinal direction of each sheet bodies 11 and 12 i.e. the container 15, and extend toward the central area of the container 15 from one and the other sides of the first wick 22A. All the second wicks 22B are linear. Particularly, 12 second wicks 22B extending toward the central area from the one side of the first wick 22A and 12 second wicks 22B extending toward the central area from the other side of the first wick 22A, face one another such that the second passage section 21B can be formed therebetween. In addition, each first passage section 21A is defined either between the first wick 22A and the second wick 22B aligned next thereto; or between two second wicks 22B.

Figure 3:
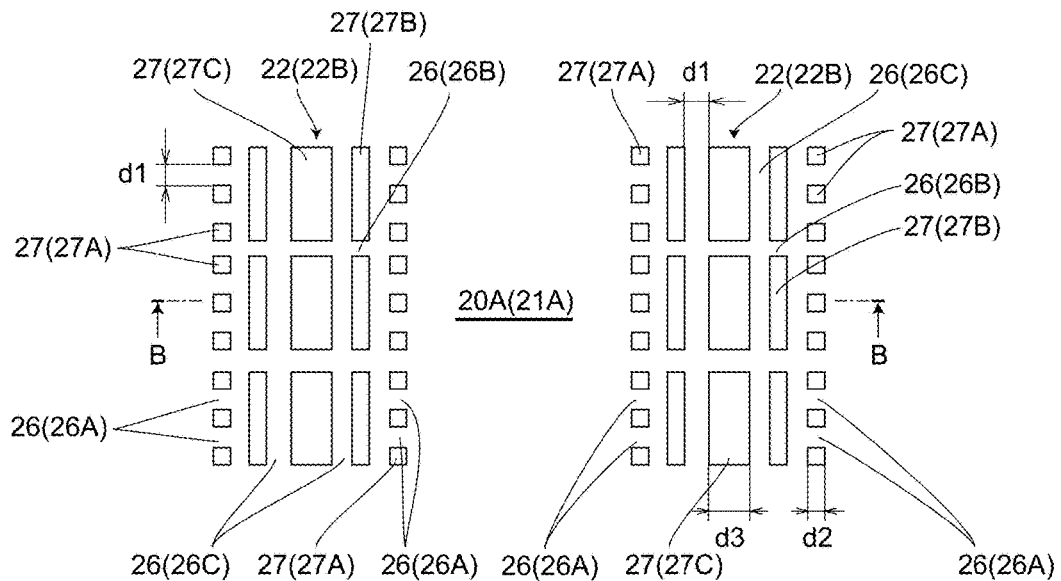
FIG. 3 is a detailed enlarged view of a section A shown in FIG. 2B of the first embodiment of the present invention.

FIG. 3 is an enlarged view showing a section A of the first sheet body 11 shown in FIG. 2B. As shown in this view, the second wicks 22B constituting the wicks 22 are composed of concave grooves 26 obtained through etching; and unetched convex walls 27. That is, in the regions of the second wicks 22B, a plurality of the grooves 26 serving as passages of the operating fluid are formed into desired shapes by the walls 27. Such a structure combining the grooves 26 and the walls 27 is ubiquitous in any part of the wicks 22.

The grooves 26 are composed of first grooves 26A, second grooves 26B and third grooves 26C serving as longitudinal grooves. Specifically, a plurality of the first grooves 26A are located along bilateral regions and end regions of the vapor passage 20, and are arranged at a given interval such that the first grooves 26A are formed orthogonal to the direction of the vapor passage 20. Further, the second grooves 26B fewer than the first grooves 26A are formed more distant from the vapor passage 20 than the first grooves 26A, and are arranged at an interval larger than that of the first grooves 26A. Furthermore, the third grooves 26C as longitudinal grooves serve to communicate these first grooves 26A and second grooves 26B with one another along the direction of the vapor passage 20. The depth t3 (See FIG. 4) of the grooves 26 is 0.1 mm to 0.13 mm. As for a width d1 of the grooves 26, each first grooves 26A, the second grooves 26B and the third grooves 26C has a width of 0.12 mm. Here, the capillary force of the wicks 22 can be improved when the width d1 of the grooves 26 is in a range of 0.05 mm to 0.3 mm. In addition, the number of the first grooves 26A provided is larger than that of the second grooves 26B, and the first grooves 26A finer than the second grooves 26B are located at the bilateral regions of and directly communicated with the vapor passage 20.

Meanwhile, the walls 27 formed among the grooves 26 are composed of at least a plurality of first walls 27A, a plurality of second walls 27B and third walls 27C. Particularly, each first walls 27A has a width d2 that is as large as 0.1 mm and established along a direction orthogonal to the vapor passage 20, for the purpose of defining the first grooves 26A at an interval smaller than that of the second grooves 26B. Further, the second walls 27B are provided to define the second grooves 26B, and the shapes of the second walls 27B are different from those of the first walls 27A. As for these third walls 27C, a width d3 thereof along the direction orthogonal to the vapor passage 20 is formed to 0.3 mm which is larger than the width d2 of each first wall 27A and the second walls 27B. In the present embodiment, the plurality of the first walls 27A and the plurality of the second walls 27B are aligned together along each side of the third walls 27C arranged in line, in a direction orthogonal to the direction of the vapor passage 20, thereby allowing the plurality of the third grooves 26C to be defined thereamong at a given interval. Preferably, when the width d2 of each first wall 27A or second wall 28B is smaller than 0.25 mm and the width d3 of each third wall 27C is no smaller than 0.25 mm, diffusion joining can be performed at where the wicks 22 are formed, with the third walls 27C of the sheet bodies 11 and 12 being laid on top of one another.

Figure 4:
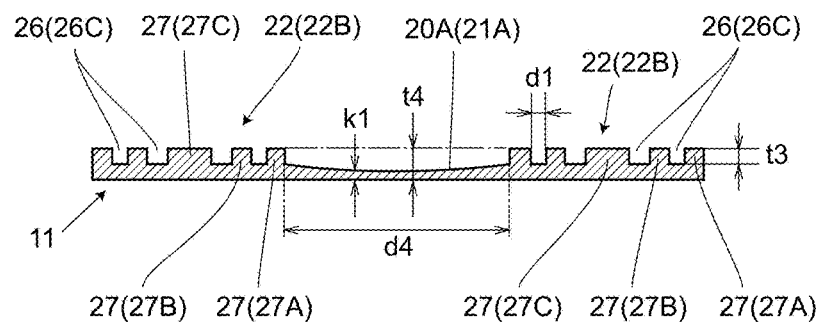
FIG. 4 is a cross-sectional view taken on a line B-B shown in FIG. 3 of the first embodiment of the present invention.

FIG. 4 is a cross-sectional view taken on a line B-B shown in FIG. 3. As shown in the figure, between the end regions of the neighboring second wicks 22B, there is defined a region of the vapor passage 20 having a width of d4; a thickness k1 of the region of the vapor passage 20 of each sheet bodies 11 and 12 is in the range of 0.03 to 0.14 mm.

The vapor passage 20 has a large cross-sectional area. Particularly, the more an aspect ratio between a depth t4 and the width d4 of the vapor passage 20 come closer to the unity (i.e. the smaller a surface area in contact with the vapor phase of the operating fluid passing through the vapor passage 20 is), the more significantly the heat transport capability of the vapor passage 20 can be improved. Meanwhile, in order to install the sheet-type heat pipe 1 in a thin chassis such as that of the mobile terminal 51 in an effortless manner, the thickness t1 of the container 15 i.e. the thickness of the sheet-type heat pipe 1 needs to be not larger than 0.5 mm. In order to achieve not only a favorable heat transportation capacity as a completed sheet-type heat pipe 1 but also to overcome the restriction of the thickness all over the container 15, the thickness k1 of a region that becomes the vapor passage 20 is limited to be not larger than 0.14 mm.

Meanwhile, when the thickness k1 is set to be smaller than 0.03 mm, the container 15 can be crashed by the atmospheric pressure outside since the container is evacuated inside. For that reason, the thickness k1 of a region that becomes the vapor passage 20 is preferably set to be no smaller than 0.03 mm.

Further, when the width d4 of the vapor passage 20 gets smaller than 0.5 mm, the cross section of the vapor passage 20 becomes too small to achieve the required heat transportation capability. Meanwhile, when the width d4 of the vapor passage 20 is larger than 2.7 mm, the container may be crashed by the atmospheric pressure outside since the container is evacuated inside. For that reason, each sheet bodies 11 and 12 has a region that eventually becomes a vapor passage 20 and the region has the width in the range of 0.5 to 2.7 mm.

For the above described reasons, regarding the vapor passage 20, favorable ratio between the thickness k1 and the width d4 is found to be in the range of 1:4 to 1:90. Particularly, if the thickness k1 is set to be 0.03 mm, there is no chance for the container 15 to be crashed by the atmospheric pressure outside as long as the width d4 is set to be not larger than 0.03.times.90=2.7 mm. Further, in case that the thickness k1 is set to be 0.14 mm, the required heat transportation capability can be achieved as long as the width d4 is set to be no smaller than 0.14.times.4=0.56 mm.

The region that eventually becomes the vapor passage 20 in each sheet bodies 11 and 12 has a thickness k1 that is not uniform in any part of the region, but progressively varies; the overall shape of the vapor passage 20 is formed into a substantially moderate arch shape so that the central region of the vapor passage 20 is formed thinner than the bilateral regions adjacent to where the grooves 26, serving as wicks 22, are formed. Inside the vapor passage 20, if the thickness k1 of the heavily stressed bilateral regions adjacent to where the grooves 26 as the wicks 22 are formed are set to be larger while the thickness k1 in the less stressed central region is set to be smaller, there is no chance for the container 15 to be crashed by the atmospheric pressure outside since the wall surface of the vapor passage 20 is stressed by the atmospheric pressure due to the fact that the inner side of the container 15 is stressed by the saturated vapor pressure of the operating fluid. Also, there can be secured a cross section of the vapor passage 20 capable of transporting the required amount of heat.

As described above, there are formed a number of the grooves 26 serving as the wicks 22 on the sheet bodies 11 and 12 through etching or pressing. As for the fine grooves 26 as the wicks 22, the larger the surface area thereof in contact with the liquid-phase operating fluid inside the container 15, the more significantly the heat transport capability improves. For this reason, the ratio between the width d1 and depth t3 of the grooves 26 in each one of the sheet bodies 11 and 12 is preferably set to be in the range of 1:1 to 2:1, so as to allow the liquid fluid contacting surface area sufficiently large while maintaining a sufficiently large area of the cross section, thereby enhancing the heat transporting capability of the wicks 22.

Further, the ratio between the width d1 of the groves 26 in each one of the sheet bodies 11, 12 and above described depth t4 of the vapor passage 20 is preferably set to be in the range of 1:0.8 to 1:1.6. In such range, inside the container 15, the liquid fluid contacting surface area, where the liquid-phase operating fluid comes into contact with the grooves 26, is allowed to be sufficiently large while a large cross section for the gas-phase operating fluid to pass through the vapor passage 20 is provided, thereby enhancing the heat transporting capability of the sheet-type heat pipe 1.

Figure 5:
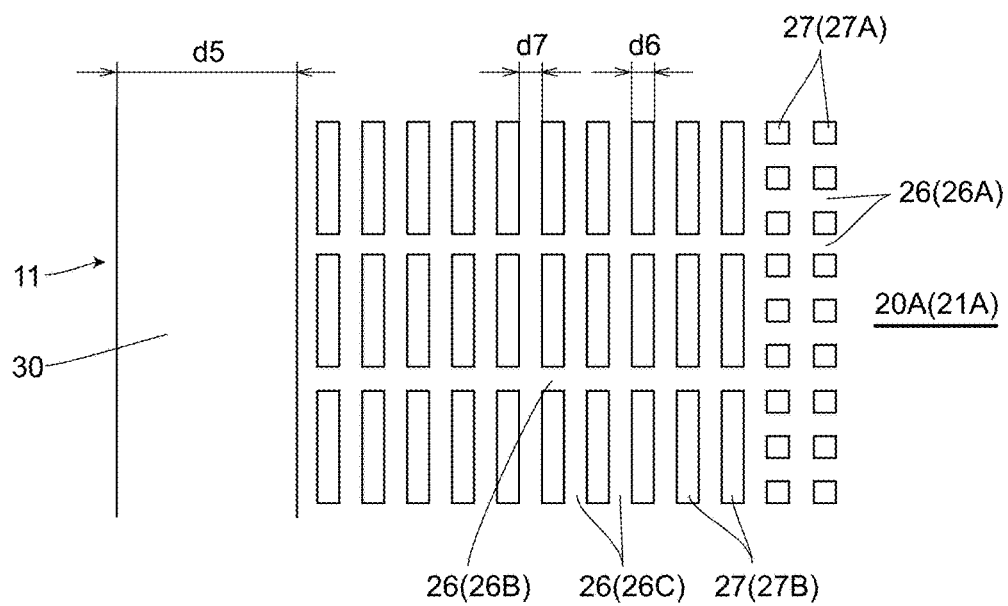
FIG. 5 is a detailed enlarged view of a section C shown in FIG. 2B of the first embodiment of the present invention.

FIG. 5 is a detailed enlarged view of a section C of the first sheet body 11 shown in FIG. 2B. As shown in the view, the first wicks 22A constituting the wicks 22 are composed of concave grooves 26 and convex walls 27. That is, in the regions of the first wicks 22A, a plurality of the grooves 26 serving as passages of the operating fluid are formed into desired shapes by the walls 27. Particularly, the grooves 26 of the first wicks 22A are composed of the aforementioned first grooves 26A, second grooves 26B and third grooves 26C. Specifically, the walls 27 of the first wicks 22A comprise only the first walls 27A and the second walls 27B; the walls 27 are provided with no third wall 27C that is wider than each of the first walls 27A and second walls 27B. Further, in a direction orthogonal to the direction of the vapor passage 20, side walls 30 are arranged on one side of the multiple rows of the second walls 27B, whereas arranged on another side thereof are the plurality of the first walls 27A, thereby allowing the plurality of the third grooves 26C to be defined thereamong at a given interval.

In the present embodiment, the third grooves 26C are provided as a 12-row longitudinal grooves of the first wicks 22A. In order to form the third grooves 26C, there are provided the first walls 27A, the second walls 27B and the convex side walls 30, the walls 27A and 27B provided as a 12-row convex walls, and the convex side walls 30 being provided outside of the first wicks 22A.

The sheet bodies 11 and 12 formed as metal sheets constituting the container 15 are formed so that the width d5 of the contact surface of the side walls 30 is set to be in the range of 0.2 to 1.9 mm when laminating the sheet bodies 11 and 12 in which the side walls are provided as peripheral walls that are formed outside of the first wicks 22A. The completed sheet-type heat pipe 1, thereby, brings about the required sealability and proper strength as the container 15. Meanwhile, regarding the first walls 27A and the second walls 27B, both of them provided only for constituting grooves 26 of the first wicks 22A, it is preferable for the width d6 of the walls to be formed narrow since the narrower walls lead to finer grooves 26. In the present embodiment, the width d6 is set to be 0.1 mm which is equal to the above descried width d2 that is narrower than a width d7 of the third grooves 26C; the width d7 is set to be 0.12 mm which is equal to that of the width d1. That is, regarding the first wicks 22A, the width d7 of the third grooves 26C; the width d6 of the first walls 27A or that of the second walls 27B; and the width d5 of the side walls 30 formed outside of the first wicks 22A are each set so as to satisfy the following relation: d5>d7>d6. By maintaining such relation of the width, the container 15 is allowed to maintain its strength while allowing the container to remain sealed, thereby optimizing a surface area on which the liquid-phase operating fluid contact grooves 26 of the first wicks 22A; and a cross section where the gas-phase operating fluid in the vapor passage 20 pass through, thus enhancing the heat transporting capability as the sheet-type heat pipe 1.

Figure 6:
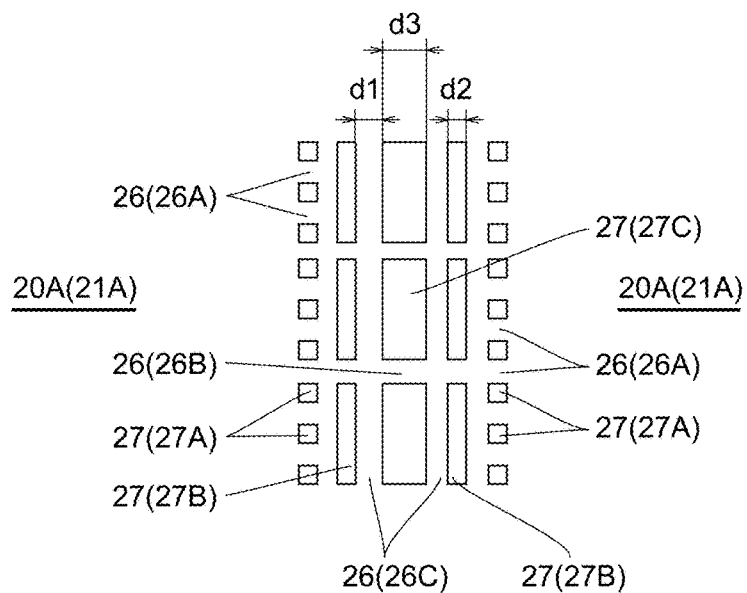
FIG. 6 is a detailed enlarged view of a section D shown in FIG. 2B of the first embodiment of the present invention.
Figure 7:
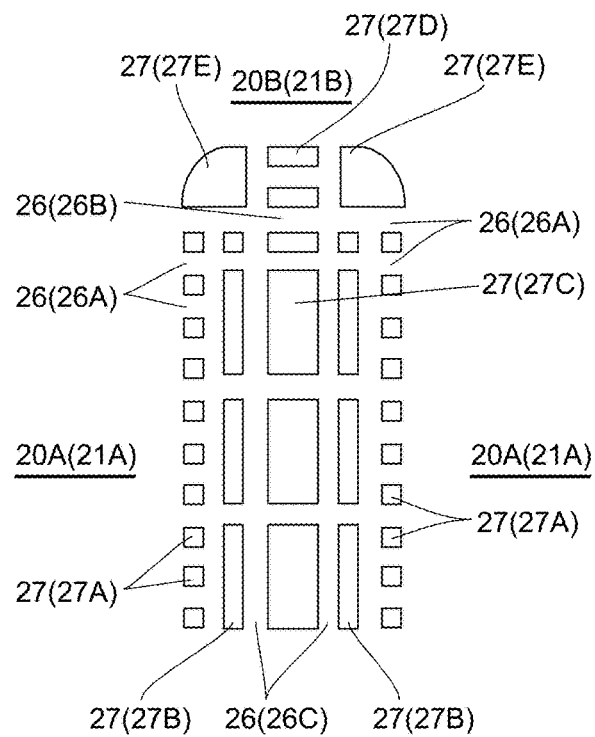
FIG. 7 is a detailed enlarged view of a section E shown in FIG. 2B of the first embodiment of the present invention.

FIG. 6 is a detailed enlarged view of the section D of the first sheet body 11 shown in FIG. 2B while FIG. 7 is that of the section E. FIG. 6 shows enlarged view of the nearly intermediate part of the second wicks 22B while FIG. 7 shows enlarged view of the distal part of the wicks 22B; its configuration and dimensions are as described with reference to FIG. 3 and FIG. 4. Particularly, the distal end of the second wicks 22B is provided with a plurality of fourth walls 27D and fan-shaped fifth walls 27E along with the first walls 27A, the second walls 27B and the third walls 27C. More particularly, the fourth walls 27D are arranged in the same row as the third walls 27C and have the same width d3 as that of the third walls 27C; the width of the fourth walls 27D in the direction along the vapor passage 20 is shorter than that of the third walls 27C. Also, on both sides of the fourth walls 27D, provided are the fan-shaped fifth walls 27E. The arrangement of those walls forms the first grooves 26A, the second grooves 26B and the third grooves 26C.

Referring to FIG. 6, in the present embodiment, the third grooves 26C are provided as a 4-row longitudinal grooves of the second wicks 22B. In order to form the third grooves 26C, there are provided: a single row of the third walls 27C as wide convex walls; and four rows of narrow first walls 27A and second walls 27B.

The sheet bodies 11 and 12 formed as metal sheets constituting the container 15 are formed so that the width d3 of the contact surface of each third walls 27C is set to be in the range of 0.2 to 1.9 mm when laminating the sheet bodies 11 and 12 in which the third walls 27C are provided as the first convex walls of the second wicks 22B. The completed sheet-type heat pipe 1, thereby, bring about required sealability and proper strength as the container 15. Meanwhile, regarding the first walls 27A and the second walls 27B, both of them provided as the second convex walls only for constituting grooves 26 of the first wicks 22A, it is preferable for the width d2 of the walls to be formed narrow since narrower walls lead to finer grooves 26. In the present embodiment, the width d2 is set to be 0.1 mm which is narrower than the width d1 of the third grooves 26C. That is, regarding the first wicks 22B, the width d1 of the third grooves 26C; the width d2 of the first walls 27A or that of the second walls 27B; and the width d3 of the third walls 27C are each set so as to satisfy the following relation: d3>d1>d2. By maintaining such relation of the width, the container 15 is allowed to maintain proper strength while allowing the container to remain sealed, thereby optimizing a surface area on which the liquid-phase operating fluid contact grooves 26 of the second wicks 22B; and a cross section where the gas-phase operating fluid in the vapor passage 20 pass through, thus enhancing the heat transporting capability as the sheet-type heat pipe 1.

In addition, the locations of the heat receiving portion and the heat dissipation portion vary in accordance with the location where the sheet-type heat pipes 1 described in FIG. 1 is thermally connected to the heat source. However, since the plurality of the first vapor paths 20A formed inside the container 15 are all communicated with the single second vapor path 20B, a thermal uniformity can be achieved in the entire area of the sheet-type heat pipe 1 regardless of where the heat receiving portion and the heat dissipation portion are located in the sheet-type heat pipe 1.

Described hereunder are the structures, functions and effects of the sheet-type heat pipes 1 of the aforementioned embodiments when installed in the thin mobile terminal 51.

Figure 8:
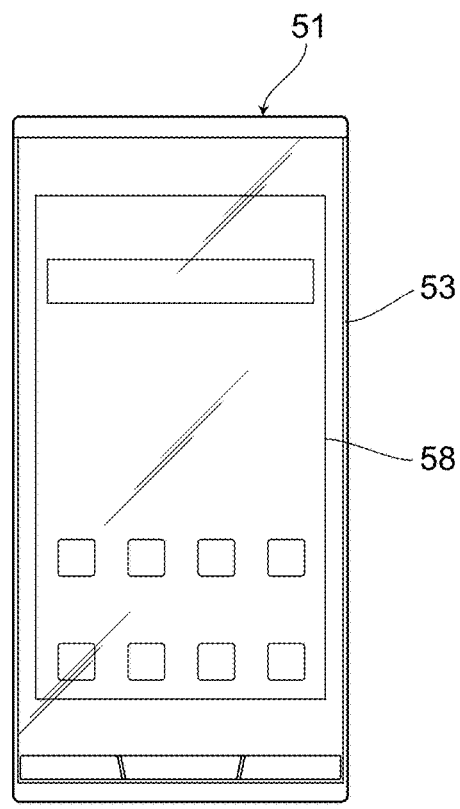
FIG. 8 is an external view of a smartphone as a mobile terminal in which the sheet-type heat pipe shown in FIG. 1A
Figure 9A:
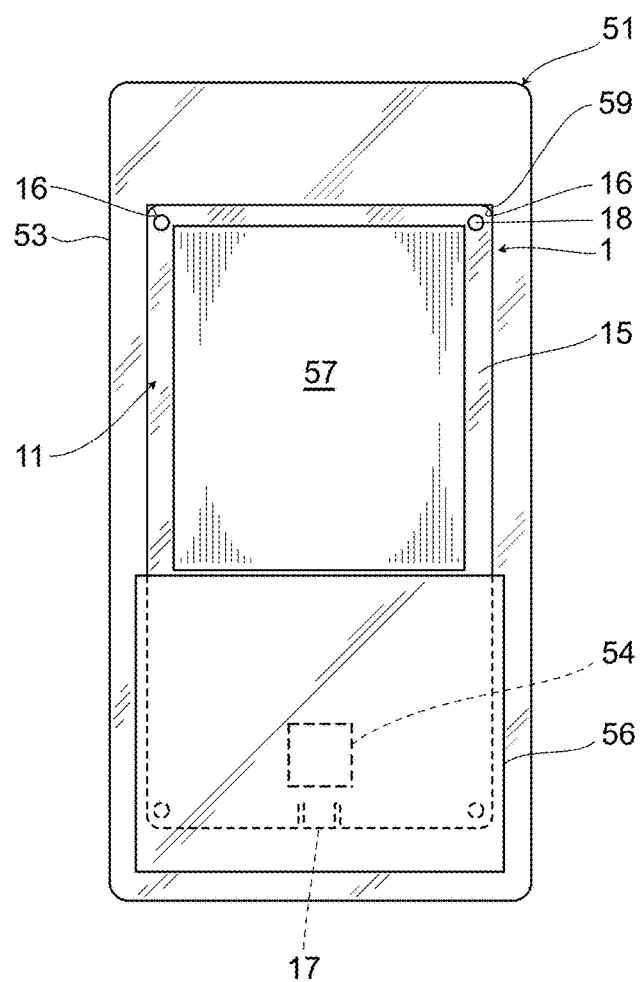
FIG. 9A is a rear view of a mobile terminal without a rear cover but with the sheet-type heat pipe shown in FIG. 1A and FIG. 1B, the sheet-type heat pipe being installed between a rear surface of a touch panel and the motherboard, or between the rear surface of the touch panel and a battery pack.
Figure 9B:
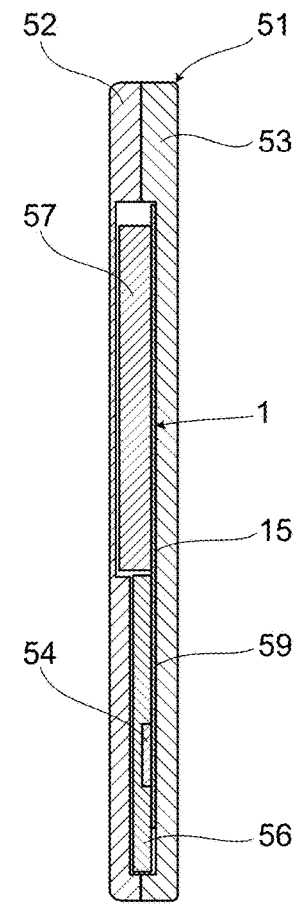
FIG. 9B is a vertical cross-sectional view of the mobile terminal with the rear cover and with the sheet-type heat pipe shown in FIG. 1A and FIG. 1B, the sheet-type heat pipe being installed between the rear surface of the touch panel and the motherboard, or between the rear surface of the touch panel and the battery pack.

FIG. 8 shows the outer appearance of the mobile terminal 51 in which the sheet-type heat pipe 1 is to be installed. Further, FIG. 9A and FIG. 9B show the inner structure of the mobile terminal 51 in which the sheet-type heat pipe 1 shown in FIG. 1 has been installed. The mobile terminal 51 shown in FIG. 8, FIG. 9A and FIG. 9B is a smartphone that is formed smaller than a tablet terminal and has an external size small enough to be held by hand. Particularly, the mobile terminal 51 includes a longitudinal rear cover 52 that is substantially formed into a rectangular shape. Here, a flat outer frame (chassis) of the mobile terminal 51 is formed by attaching the rear cover 52 to the rear surface region of a tabular touch panel 53. Disposed inside the chassis of the mobile terminal 51 are a CPU (central processing unit) 54 serving as a control unit of the mobile terminal 51; various electronic components (not shown) other than the CPU 54; a motherboard 56 serving as a substrate; and a rechargeable battery pack 57 that is formed into a flat and substantially rectangular shape and is used as a charging component to supply necessary electric power to the CPU 54 and other electronic components. Specifically, the CPU 54 and the various electronic components other than the CPU 54 are mounted on the motherboard 56 when disposed inside the mobile terminal 51; and the battery pack 57 is in fact detachably received in the mobile terminal 51. Further, provided on the front surface region of the touch panel 53 is an operation display 58 formed by integrally combing an input and output devices; whereas the rear surface of the touch panel 53 that faces the front surface region opening section of the rear cover 52 is composed as a flat and smooth metal plate 59 such as an aluminum plate. The operation display 58 is exposed on the front surface of the mobile terminal 51 such that the user can touch the operation display 58 with his/her finger(s).

As shown in FIG. 9A and FIG. 9B, the sheet-type heat pipe 1 of the first embodiment has the outer shape matched to the chassis inner shape of the mobile terminal 51. That is, the single sheet-type heat pipe 1 can be installed inside the chassis of the mobile terminal 51 as it is. Here, it is preferred that the sheet-type heat pipe 1 be installed in a region occupying not less than 50% of the rear surface of the touch panel 53. One part of the side surface of the sheet-type heat pipe 1 serves as a heat receiving portion, and is in contact with and thermally connected to the motherboard 56 including CPU 54 as a heat source. Meanwhile, the other part of the side surface of the sheet-type heat pipe 1 serves as a heat dissipation portion, and is in contact with and thermally connected to the battery pack 57. Moreover, another side surface of the sheet-type heat pipe 1 is entirely in contact with and thermally connected to the metal plate 59 as the rear surface of the touch panel 53; particularly, a portion of such another side surface that is distant from the CPU 54 is formed as a heat dissipation portion. That is, the sheet-type heat pipe 1 is disposed between a rear surface of the touch panel 53 and the motherboard 56, or between the rear surface of the touch panel 53 and the battery pack 57.

As for the mobile terminal 51 shown in FIG. 9A and FIG. 9B, when the CPU 54 or the like produces heat such that the temperature inside the chassis increases, the heat from the CPU 54 will be transported to the heat receiving portion of the one side surface of the sheet-type heat pipe 1. Accordingly, the operating fluid will evaporate at the heat receiving portion, and the vapor thus generated will then flow from the heat receiving portion toward the heat dissipation portion having a low temperature, through the vapor passage 20. In other words, heat transport takes place inside the sheet-type heat pipe 1. The heat transported to the heat dissipation portion will be thermally diffused in a large and planar region of the sheet-type heat pipe 1, and will then be released to both the battery pack 57 and the metal plate 59 as the rear surface of the touch panel 53 from the front and rear sides, i.e. the one and other side surfaces of the sheet-type heat pipe 1. In this way, since the mobile terminal 51 allows the heat produced by the CPU 54 or the like to be thermally diffused in a large area, a heat spot(s) occurring on the outer frame surface of the touch panel 53 or the like can be alleviated, thereby making it possible to restrict the temperature of the CPU 54 from increasing.

Moreover, although the vapor will be condensed such that the operating fluid will then be collected at the heat dissipation portion of the sheet-type heat pipe 1, the operating fluid will actually be brought back from the heat dissipation portion to the heat receiving portion through a strong capillary force of the wicks 22 that are formed on both sides of the vapor passage 20 inside the sheet-type heat pipe 1. Specifically, the operating fluid is brought back to the heat receiving portion by travelling from the fluid passages of the first grooves 26A and the second grooves 26B that are orthogonal to the vapor passage 20 through the fluid passage of the third grooves 26C that is formed along the vapor passage 20. Therefore, the operating fluid shall never be absent at the heat receiving portion; particularly, the operating fluid that has evaporated at the heat receiving portion will be guided to the heat dissipation portion along the wicks 22 through the capillary force, thereby allowing evaporation to continuously take place, thus allowing the sheet-type heat pipe 1 to exhibit its primary capabilities.

Further, the thickness t1 of the sheet-type heat pipe 1 itself is not larger than 0.5 mm. Especially, in the case of the mobile terminal 51 such as a smartphone, the sheet-type heat pipe 1 can be used in the chassis thereof that is limited to a certain thickness for ease of use. Particularly, the sheet-type heat pipe 1 allows the heat of the CPU 54 or the like to be swiftly and thermally diffused in a large area while exhibiting and maintaining a significantly favorable thermal conductivity as compared to a graphite sheet.

Figure 10A:
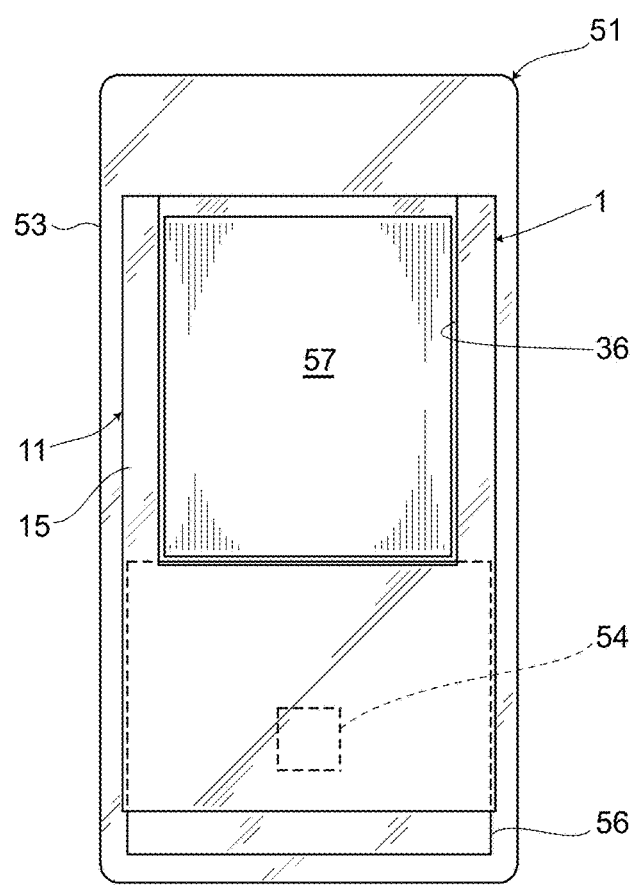
FIG. 10A is a rear view of a mobile terminal without a rear cover but with a sheet-type heat pipe whose shape being different from the one shown in FIG. 1A and FIG. 1B, the sheet-type heat pipe being installed between a rear cover of a chassis and the motherboard.
Figure 10B:
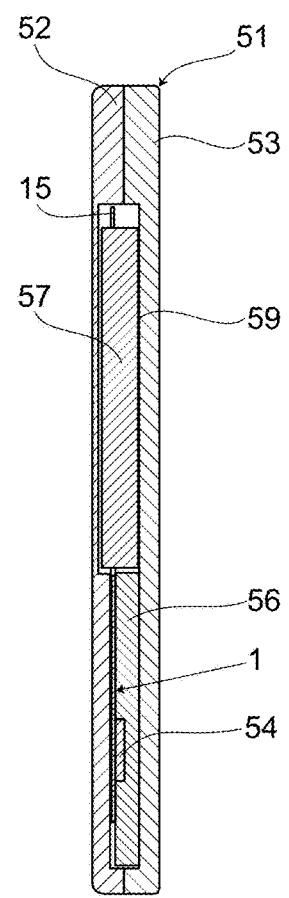
FIG. 10B is a vertical cross-sectional view of the mobile terminal with the rear cover and with the sheet-type heat pipe whose shape being different from the one shown in FIG. 1A and FIG. 1B, the sheet-type heat pipe being installed between the rear cover of the chassis and the motherboard.

Furthermore, FIG. 10A and FIG. 10B show an inner structure of the mobile terminal 51 in which a sheet-type heat pipe 1 whose shape differs from the one shown in FIG. 1 has been installed. Here, the sheet-type heat pipe 1 includes an escape section 36 as a region interfering with the chassis of the mobile terminal 51. Particularly, the escape section 36 is provided to avoid an inference with the battery pack 57. For this reason, the sheet-type heat pipe 1 can be installed in the chassis of the mobile terminal 51 without coming into contact with the battery pack 57, thereby also making it possible to alleviate a heat influence inflicted upon the battery pack 57 by the sheet-type heat pipe 1. Other than the region of the battery pack 57, the aforementioned escape section 36 may be provided in regions interfering with various functional components that are installed inside the chassis of the mobile terminal 51.

As shown in FIG. 10A and FIG. 10B, one part of the side surface of the sheet-type heat pipe 1 serves as a heat receiving portion, and is in contact with and thermally connected to a motherboard 56 that includes the CPU 54 as a heat source while another side surface of the sheet-type heat pipe 1 is partially in contact with and thermally connected to the rear cover 52 of the chassis; especially, a portion of such another side surface that is distant from the CPU 54 is formed as a heat dissipation portion. That is, inside the chassis of the mobile terminal 51, the sheet-type heat pipe 1 herein is disposed between the rear cover 52 and the motherboard 56 having the CPU 54.

As for the mobile terminal 51 shown in FIG. 10A and FIG. 10B, when the CPU 54 or the like produces heat such that the temperature inside the chassis increases, the heat from the CPU 54 will be transported to the heat receiving portion of the one side surface of the sheet-type heat pipe 1. Accordingly, the operating fluid will evaporate at the heat receiving portion, and the vapor thus generated will then flow from the heat receiving portion toward the heat dissipation portion having a low temperature, through the vapor passage 20. In other words, heat transport takes place inside the sheet-type heat pipe 1. The heat transported to the heat dissipation portion will be thermally diffused in a large and planar region of the sheet-type heat pipe 1, and will then be released to the rear cover 52 of the chassis from another side surface of the sheet-type heat pipe 1. In this way, since the mobile terminal 51 allows the heat produced by the CPU 54 or the like to be thermally diffused in a large area, a heat spot(s) occurring on the outer frame surface of the rear cover 52 or the like can be alleviated, thereby making it possible to restrict the temperature of the CPU 54 from increasing.

Moreover, although the vapor will be condensed such that the operating fluid will be collected at the heat dissipation portion of the sheet-type heat pipe 1, the operating fluid will actually be brought back from the heat dissipation portion to the heat receiving portion through a strong capillary force of the wicks 22 that are formed on both sides of the vapor passage 20 inside the sheet-type heat pipe 1. Specifically, the operating fluid is brought back to the heat receiving portion by travelling from the fluid passages of the first grooves 26A and the second grooves 26B that are orthogonal to the vapor passage 20 through the fluid passage of the third grooves 26C that is formed along the vapor passage 20. Therefore, the operating fluid shall never be absent at the heat receiving portion; particularly, the operating fluid that has evaporated at the heat receiving portion will be guided to the heat dissipation portion along the wicks 22 through the capillary force, thereby allowing evaporation to continuously take place, thus allowing the sheet-type heat pipe 1 to exhibit its primary capabilities.

FIG. 11 shows test results obtained by comparing with one another the ways the temperature of the mobile terminal 51 increases due to differences in a cooling structure. As shown in FIG. 11, a test was performed on the following cooling structures including a structure called "embodiments of the present invention (sheet-type heat pipe)" obtained by installing the sheet-type heat pipe 1 shown in FIG. 1 inside the chassis of the mobile terminal 51; a structure called "Another embodiment (HP+copper plate t 0.2)" obtained by installing inside the chassis of the mobile terminal 51 the cooling unit that is prepared by solder-connecting to a copper plate having a dimension of: width 60 mm; Height H of 105 mm; thickness 0.2 m, a single flat-type heat pipe formed by flattening a pipe shaped container having a diameter of 2 mm(D2); and a structure called "Related art (Graphite sheet)" obtained by installing a graphite sheet as a cooling unit inside the chassis of the mobile terminal 51. Specifically, the test was to measure: a temperature of a heat source heater (not shown) that is mounted as a heat source in place of the CPU 54; a front surface temperature of the touch panel 53 of the mobile terminal 51; and a rear surface temperature of the rear cover 52 of the mobile terminal 51. More specifically, these temperatures are shown in the figures as "Heat source temperature", "Outer frame temperature (touch panel)" and "Outer frame temperature (Chassis rear surface)" Especially, as for the "Outer frame temperature (Chassis rear surface)" and a "Outer frame temperature (touch panel)", shown are images of temperature distributions on the entire surfaces as well as the maximum temperature of the surface shown in digit numbers. Further, also shown in the figure regarding each cooling structures are "heat dissipation evaluation"; "Primary specification" that are external dimensions; a "Heat radiation areas" as a cooling unit; a "HP thickness" corresponding to the heat pipe thickness; and a "Overall thickness" corresponding to the cooling unit thickness; of each cooling structure.

The test was performed by attaching the heat-source heater, as a heat source, to a smartphone as the mobile terminal 51. As the test conditions, an ambient temperature was set to be 25° C.; the heat value of the heat-source heater was set to be 5 W; and measured was a temperature obtained after 20 minutes had elapsed. As for "embodiments of the present invention (sheet-type heat pipe)" in the figure, the test was performed on the sheet-type heat pipe 1 shown in FIG. 1A and FIG. 1B. Particularly, the test was performed on the sheet-type heat pipes 1 each having a width of 60 mm, 45 mm, 30 mm and 15 mm. The height H of the sheet-type heat pipe 1 in each illustrations was 105 mm. The copper plate used in "Another embodiment (HP+copper plate t 0.2)" and the graphite sheet of "Related art (Graphite sheet)" also have the same width W and height H as those described above. "Heat radiation areas" as a cooling unit are defined to be the width W times the height H.

"Heat dissipation evaluation" in the figure shows comparative test results of heat dissipation evaluation. The test was performed by measuring the heat source temperature rise value and surface temperature distributions of the chassis in such a condition that, in the chassis of the mobile terminal 51, installed are one of the above described cooling units and a ceramic heater serving as a heat source having a calorific value of 5 W, and a condition that the heat source and the cooling unit are thermally connected via a thermal grease, in which each cooling structures has a copper plate connected to the sheet type heat pipe 1 or to the flat-type heat pipe.

The test results indicate that heat dissipation quality in the "embodiments of the present invention (sheet-type heat pipe)" is excellent, due to their unique structure of the vapor passage 20 and wicks 22, as compared to those having other structures, e.g. "Another embodiment (HP+copper plate t 0.2)" or "Related art (Graphite sheet)") even when the thickness of the heat pipe is thin or when the heat radiation area is narrow, thereby keeping the temperature of the heat source and that of outer frame of the chassis low. For that reason, there can be obtained a sheet-type heat pipe that is compact and excellent in cooling capability.

Particularly, regarding the sheet-type heat types 1 each having the width W of 60 mm and the width of 45 mm in the "embodiments of the present invention (sheet-type heat pipe)," the temperature of the heat source and that of outer frame of the chassis were kept low, exhibiting an excellent heat dissipation capability. Also, as for a case where the sheet-type heat pipe 1, having the width W of 30 mm, is used, the result showed favorable heat dissipation for the one in the "embodiments of the present invention (sheet-type heat pipe)" along with the one shown in "Another embodiment (HP+copper plate t 0.2)." Further in a case where the sheet-type heat pipe 1 having the width W 15 mm is used in the "embodiments of the present invention (sheet-type heat pipe)," the heat source temperature did not exceed 100° C., but the heat dissipation capability was found to be poor compared to the one having the width 30 mm or the one shown in "Another embodiment (HP+copper plate t 0.2)." In this way, in order to improve the cooling capability of the sheet-type heat pipe 1, it is preferred that the heat radiation area be secured as large as possible inside the chassis.

As described above, as for the sheet-type heat pipe of the present invention, the sealed container 15 comprises at least two etched or pressed metal foil sheet bodies 11 and 12 stacked and joined together.

In this case, etching or pressing is performed on one or both side surfaces of the sheet bodies 11 and 12, and the container is sealed by joining at least two sheet bodies 11 and 12. For this reason, fine concavities and convexities can be formed on the inner surface of the container 15, and thus there can be obtained a thin sheet-type heat pipe 1 having a sufficient heat transport capability even when the thickness t1 of the sealed container 15 is set to be, e.g. not larger than 0.5 mm. Moreover, since the container 15 is formed thin, the sheet-type heat pipe 1 of the present embodiment can be effortlessly installed in a thin chassis such as that of the mobile terminal 51.

Further, the sheet bodies 11 and 12 each include a vapor passage 20 and a part of the grooves 26 constituting the wicks that are formed through half etching, the sheet bodies 11 and 12 forming the sealed container 15 to thickness t1 no larger than 0.5 mm when stacked and joined together.

In this case, by performing half-etching on the surfaces of the sheet bodies 11 and 12, there can be formed on the inner surface of the container 15 the fine vapor passage 20 and the grooves 26 of the wicks 22 having a sufficient heat transport capability. Further, since the thickness t1 of the container 15 formed by laminating the sheet bodies 11 and 12 is set to be not larger than 0.5 mm, the sheet-type heat pipe 1 can be effortlessly installed even in a thin chassis of, e.g. the mobile terminal 51.

Further, each of sheet bodies 11 and 12 has a region that eventually becomes the vapor passage 20 and the region preferably has a thickness k1 in the range of 0.03 to 0.14 mm.

In this case, as a result of limiting the thickness k1 of the region that becomes vapor passage 20, to not larger than 0.14 mm, not only the heat transportation capability of the vapor passage 20 can be improved, but the overall thickness of the container 15 can be restricted as well.

Meanwhile, if the thickness k1 is set to be no smaller than 0.03 mm, the container 15 can be prevented from being crashed by the atmospheric pressure even when the container 15 is sealed and evacuated inside.

Further, each sheet bodies 11 and 12 has a region that eventually becomes a vapor passage 20 and the region preferably has a width d4 in the range of 0.5 to 2.7 mm.

Particularly, by setting the width d4 of the region that becomes the vapor passage 20, to be no smaller than 0.5 mm, cross section required as a vapor passage 20 can be ensured to achieve a desired heat transportation capability. On the other hand, if the width d4 of the region that becomes the vapor passage 20 is set to be not larger than 2.7 mm, the container 15 can be prevented from being crashed by the atmospheric pressure even when the container 15 is sealed and evacuated inside.

Further, a thickness k1 to width d4 ratio of a region that eventually becomes a vapor passage in each sheet bodies 11 and 12 is preferably in the range of 1:4 to 1:90.

In this case, by properly setting the ratio between the thickness k1 and width d4 in the region of each sheet bodies 11 and 12 that becomes the vapor passage 20, heat transportation in the vapor passage can be enhanced while limiting the overall thickness of the container 15. In addition, the container 15 can be prevented from being crashed by the atmospheric pressure. Further, it is preferred that the region that eventually becomes a vapor passage 20 in each sheet bodies 11 and 12 is configured such that a portion adjacent to where the grooves 26 as wicks 22 are formed is thicker than the central portion of the vapor passage 20

In this case, by thickly forming the heavily stressed regions adjacent to where the grooves 26 serving as wicks 22 are formed while by thinly forming the one in the less stressed central region, not only the container 15 can be prevented from being crashed by the atmospheric pressure but required cross section for the vapor passage 20 can be ensured as well since, inside the vapor passage, the wall surface of the vapor passage 20 is stressed by the atmospheric pressure due to the fact that the inner side of the container 15 is stressed by the saturated vapor pressure of the operating fluid.

Further, it is preferred that a region that eventually becomes the vapor passage 20 in each of sheet bodies 11 and 12 is formed to have a thickness varying in a substantially arch shape.

Also in this case, the wall surface of the vapor passage 20 are stressed by the atmospheric pressure due to the fact that the inner side of the container 15 is stressed by the saturated vapor pressure of the operating fluid. For this reason, in the vapor passage, by thickly forming the heavily stressed bilateral regions of the arch shaped passage while by thinly forming the one in the less stressed central region, not only the container 15 can be prevented from being crashed by the atmospheric pressure outside but required cross section for a vapor passage 20 can be ensured as well.

Further in the present embodiment, fine grooves 26 formed as wicks 22 on each of sheet bodies 11 and 12 each have a width d1 to depth t3 ratio in the range of 1:1 to 2:1

In this case, as for the fine grooves 26 formed as the wicks 22, the larger the surface area thereof in contact with the liquid-phase operating fluid, the more significantly the heat transport capability improves. For this reason, by properly setting the ratio between the width d1 and depth t3 of the grooves 26 in such a way to keep sufficient area of the cross section thereof, while providing sufficiently large liquid contacting surface area, the heat transportation capability of the wicks is allowed to be enhanced.

Further in the present embodiment, the sheet bodies 11 and 12 each include the vapor passage 20 and the grooves 26 as wicks 22 such that the ratio of the width d1 of the grooves 26 to the depth t4 of the vapor passage 20 in each sheet bodies 11 and 12 is in the range of 1:0.8 to 1:1.6

In this case, by properly setting the ratio between the width d1 of the grooves 26 serving as the wicks 22 and the depth t4 of the vapor passage 20, the contacting surface area for liquid-phase operating fluid is allowed to be sufficiently large while providing a large cross section for the gas-phase operating fluid passing through the container 15, thereby enhancing the heat transportation capability.

In the present embodiment, the container 15 includes: a first wick 22A that comprises fine grooves 26 and is formed on the substantially entire outer circumference of the container 15; and a second wick 22B extending from the first wick 22A toward the central region of the container.

In this case, since the function of the wicks 22 is to reflux the liquid-phase operating fluid, if the wicks 22 are arranged to form the second wicks 22B extending from the first wicks 22A formed on the outer circumference of the container 15, toward the central region of the container 15, operating fluid are allowed to be refluxed no matter where the heat source of e.g. the mobile terminal 51 might be located, thereby allowing favorable heat transportation of the sheet-type heat pipe 1, thus obtaining sufficient heat dissipation.

In the present embodiment, the first wick 22A comprises more grooves 26 than the second wick 22B.

In this case, reflux of the liquid-phase operating fluid is categorized into: the first reflux passing from the second wicks 22B that extend toward the central region of the container 15, into the first wicks 22A formed on the outer circumference thereof; and the second reflux diverging from the first wicks 22A formed on the outer circumference thereof into the second wicks 22B extending toward the central region, the reflux being brought back from the heat dissipation portion to the heat receiving portion. Here, reflux amount of the first wicks 22A is larger than that of the second wicks 22B. Hence, if the number of the grooves 26 constituting the first wicks 22A is larger than the number of those constituting the second wicks 22B, the liquid-phase operating fluid is allowed to be refluxed smoothly in the container 15.

Moreover, the first wicks 22A of the present invention comprises the grooves 26 and further, the grooves 26 are provided with the first walls 27A and the second walls 27B, both of them serving as convex walls to form, e.g. the third grooves 26C. Particularly, the width d7 of the third grooves 26C; the width d6 of the first walls 27A or the second walls 27B; and the width d5 of the side walls 30 serving as peripheral walls formed outside the first wicks 22A satisfy the inequality expression of d5>d7>d6.

In this case, regarding the sheet bodies 11 and 12 constituting the container 15, in order to obtain the required sealability and proper strength as the container 15, the width d5 of the contact surface of the side walls 30 is preferably set to be in the range of, e.g. 0.2 to 1.9 mm when laminating the two sheet bodies 11 and 12 in which the side walls are provided as peripheral walls that are formed outside the first wicks 22A.

Meanwhile, regarding the first walls 27A and the second walls 27B, both of them provided only for constituting grooves 26 of the first wicks 22A, it is preferable for the width d6 of the walls to be formed narrow since the narrower walls lead to finer grooves 26. In the present embodiment, the width d6 is set to be 0.1 mm which is narrower than the width d7 of the third grooves 26C. For that reason, by properly setting the relative dimensions of the width d5 of the side walls 30; the width d7 of the third grooves 26C, the width being identical with that of the first wicks 22A that are desirably finely constructed; and the width d6 of the first walls 27A and second walls 27B constituting the grooves of the first wicks 22A, the container 15 is allowed to maintain its strength in a proper manner while allowing the container to remain sealed, thereby optimizing the surface area where the liquid-phase operating fluid contact the first wicks 22A; and the cross section where the gas-phase operating fluid in the vapor passage 20 passes through, thus leading to the enhancement of heat transporting capability.

Moreover, the second wicks 22B of the present invention include: the grooves 26; the third walls 27C as wide first convex walls that form a part of the grooves 26; and the first walls 27A and the second walls 27B serving as narrow second convex walls to form another part of the grooves 26. Particularly, the width d1 of the third grooves 26C constituting the groves 26; the width d2 of the first walls 27A or the second walls 27B; and the width d3 of the third walls 27C satisfy an inequality expression of d3>d1>d2.

In this case, regarding the sheet bodies 11 and 12 constituting as the container 15, in order to obtain the required sealability and proper strength of the container 15, the width d3 of the contact surface is preferably set to be in the range of, e.g. 0.2 to 1.9 mm when laminating the two sheet bodies 11 and 12, in which the contact surfaces are provided as a wide third walls 27C in the second wicks 22B. Meanwhile, regarding the first walls 27A and the second walls 27B, both of them provided only for constituting grooves of the second wicks 22B, it is preferable for the width d2 of the walls to be formed narrow since the narrower walls lead to finer grooves 26. In the present embodiment, the width is set to be 0.1 mm which is narrower than the width d1 of the third grooves 26C. For that reason, by properly setting the relative dimensions of: the width d1 of the third grooves 26C constituting the grooves 26 of the second wicks 22B that desirably are finely constructed; the width d2 of the first walls 27A or the second walls 27B constituting the grooves of the first wicks 22A; and the width d3 of the third walls 27C, the container 15 is allowed to maintain its strength in the proper manner while allowing the container to remain sealed, thereby optimizing the surface area where the liquid-phase operating fluid contact the second wicks 22B; and the cross section where the gas-phase operating fluid in the vapor passage 20 passes through, thus leading to the enhancement of heat transporting capability.

However, the present invention is not limited to the aforementioned embodiments. In fact, various modified embodiments are feasible within the scope of the present invention. For example, in the aforementioned embodiments, although the sheet bodies 11 and 12 are diffusion-joined together, there may be employed another joining method such as ultrasonic joining. Further, three or more sheet bodies 11 and 12 can be laminated and joined together. Furthermore, the shapes or sizes of above described elements are only examples and many modifications and variations are possible within the scope of the present invention. Particularly, it is not necessary for the sheet body 11 to have the same shape as that of the sheet body 12, or vice versa.

What is claimed:

1. A sheet-type heat pipe comprising a sealed container encapsulating operating fluid thereinside, said sealed container comprising:
  at least two etched or pressed metal foil sheets stacked and joined together, said metal foil sheets each comprising:
    a vapor passage transporting a gas-phase operating fluid; and
    wicks having capillary grooves that serve to reflux a liquid-phase operating fluid through a capillary force, said wicks comprising:
      a first wick formed on a substantially entire outer circumference of said container, said first wick comprising:

first concave grooves serving as said capillary grooves; and first convex walls defining the first concave grooves, wherein said first concave grooves, said first convex walls and an outer peripheral wall formed outside said first wick satisfy an inequality expression of: a width of the outer peripheral wall>a width of each first concave groove>a width of each first convex wall; and a second wick extending from said first wick toward a central region of said container, said second wick comprising:

second concave grooves serving as said capillary grooves;

second convex walls defining said second concave grooves; and third convex walls defining said second concave grooves, wherein said second concave grooves, said second convex walls and said third convex walls satisfy an inequality expression of: a width of the second convex wall>a width of each second concave groove>a width of each third convex wall, wherein the number of the first concave grooves provided in the first wick is larger than that of the second concave grooves provided in the second wick.

2. The sheet-type heat pipe according to claim 1, wherein said metal foil sheets each include said vapor passage, said first concave grooves and said second concave grooves formed through half etching, said metal foil sheets forming said sealed container to a thickness of not larger than 0.5 mm when stacked and joined together.

3. The sheet-type heat pipe according to claim 1, wherein each metal foil sheet has a region that eventually becomes the vapor passage, said region having a thickness in a range of 0.03 to 0.14 mm.

4. The sheet-type heat pipe according to claim 1, wherein each metal foil sheet has a region that eventually becomes the vapor passage, said region having a width in a range of 0.5 to 2.7 mm.

5. The sheet-type heat pipe according to claim 1, wherein a thickness to width ratio of a region that eventually becomes the vapor passage in each metal foil sheet is in a range of 1:4 to 1:90.

6. The sheet-type heat pipe according to claim 1, wherein a region that eventually becomes the vapor passage in each metal foil sheet is configured such that a portion adjacent to where the wicks are formed is thicker than a central portion of said vapor passage.

7. The sheet-type heat pipe according to claim 1, wherein the second grooves formed in each metal foil sheet each have a width to depth ratio in a range of 1:1 to 2:1.

8. The sheet-type heat pipe according to claim 1, wherein a ratio of a width of each of the second concave grooves to a depth of said vapor passage in each metal foil sheet is in a range of 1:0.8 to 1:1.6.

\* \* \* \* \*